United States Patent [19]
Tateishi

[11] Patent Number: 5,390,189
[45] Date of Patent: Feb. 14, 1995

[54] SEMICONDUCTOR INTEGRATED CIRCUIT
[75] Inventor: Akimitsu Tateishi, Kawasaki, Japan
[73] Assignee: Kabushiki Kaisha Toshiba, Kawasaki, Japan
[21] Appl. No.: 767,799
[22] Filed: Sep. 30, 1991
[30] Foreign Application Priority Data
  Oct. 1, 1990 [JP] Japan ................................ 2-264619
[51] Int. Cl.⁶ .......................................... G01R 31/28
[52] U.S. Cl. .................................. 371/22.3; 364/579
[58] Field of Search .................... 371/22.3, 22.1, 22.5, 371/22.4; 364/579, 580; 324/73.1, 158 R; 307/463

[56] References Cited
U.S. PATENT DOCUMENTS

| | | | |
|---|---|---|---|
| 3,761,695 | 9/1973 | Eichelberger | 371/22.3 |
| 4,366,393 | 12/1982 | Kasuya | 371/22.3 |
| 4,534,028 | 8/1985 | Trischler | 371/25 |
| 4,701,920 | 10/1987 | Resnick et al. | 371/25 |
| 4,868,414 | 9/1989 | Kanazawa | 307/463 |
| 4,897,838 | 1/1990 | Tateishi | 371/22.3 |
| 4,914,379 | 4/1990 | Maeno | 371/22.3 |
| 4,947,395 | 8/1990 | Bullinger et al. | 371/22.3 |
| 4,980,889 | 12/1990 | DeGuise et al. | 371/22.3 |
| 5,054,024 | 10/1991 | Whetsel | 371/22.3 |
| 5,056,093 | 10/1991 | Whetsel | 371/22.3 |
| 5,056,094 | 10/1991 | Whetsel | 371/22.1 |
| 5,084,874 | 1/1992 | Whetsel, Jr. | 371/22.3 |
| 5,150,044 | 9/1992 | Hashizume et al. | 371/22.3 |

OTHER PUBLICATIONS

IBM Corp; "Reconfiguration Signature Generator"; IBM Technical Disclosure; vol. 34 No. 6, Nov. 1991.
IBM Corp.; "Algorithmic Pattern Generation At The Tester"; IBM Tech. Disclosure, vol. 32 No. 6A, Nov. 1989.
Strole et al.; "Testchip: A Chip For Weighted Random Pattern Generation, Evaluation, and Test Control"; IEEE J.S.S.C., Jul. 1991.
Lee et al.; "Design for Test Using Partial Parallel Scan"; IEEE Tran. CAD, vol. 9 No. 2, Feb. 1990.

Primary Examiner—Ellis B. Ramirez
Attorney, Agent, or Firm—Finnegan, Henderson, Farabow, Garrett & Dunner

[57] ABSTRACT

A semiconductor integrated circuit includes a flip-flop circuit group having flip-flop circuits of n rows×m columns, a row-direction pseudo-random number generator or row- and column-direction pseudo-random number generators, and a logic circuit block, wherein pseudo-random number data can be set in an internal logic circuit which is divided into blocks in a short period of time with a simple circuit construction and with a slight increase in the number of input and output pins and thus the test for the logic circuit block can be simplified.

15 Claims, 8 Drawing Sheets

SEMICONDUCTOR INTEGRATED CIRCUIT

BACKGROUND OF THE INVENTION

1. Field of the Invention

The present invention relates to a semiconductor integrated circuit and, more particularly, to an integrated circuit utilizing the design for testability to efficiently check an internal logic circuit thereof.

2. Description of the Related Art

In recent years, the integration density of a logic circuit has been more enhanced as the semiconductor integrated circuit technology has been more developed. The large scale integration of the logic circuit produces various advantages such as the enhancement of the function of the logic circuit and reduction in the weight thereof, but at the same time, the large scale integration makes it extremely difficult to execute the test of the logic circuit itself and create test data for the test. As a result, a design which is made by taking the test into consideration, or a so-called design for testability has been gradually used at the design stage of the logic circuit.

In the conventional design for testability a method called a scan design system and a method of adding a compact test system called a self-test circuit have been generally used and these methods are described below.

Figure 1:
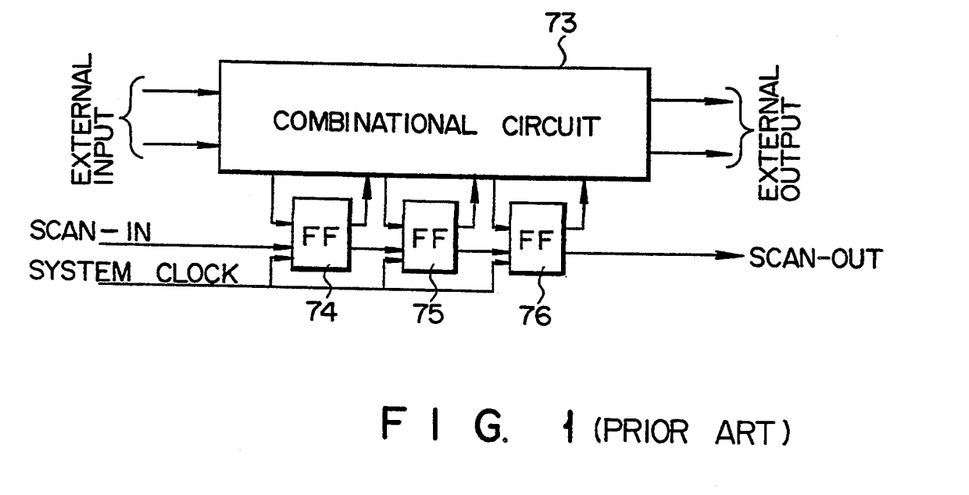
FIG. 1 is a block diagram showing the conventional scan design system.

As shown in FIG. 1, the scan design system is a method to directly set the data state of flip-flop (FF) circuits 74 to 76 of the logic circuit in the integrated circuit from the exterior of the integrated circuit by effecting the scan-in operation using the shift register, input the thus set data to a combinational circuit 73 by use of the system clock, operate the entire portion of the LSI, output the data state of the combinational circuit 73 to the flip-flop circuits 74 to 76, and then scan out the same via the shift register so that the internal state of the combinational circuit 73 can be checked and thus the defect checking test of the combinational circuit 73 can be simplified. In other words, the test of the sequential circuit is replaced by the test of the combinational circuit by regarding the input and output terminals of the flip-flop circuits 74 to 76 as the external terminals of the integrated circuit. Therefore, if the scan design system is used, a test vector can be automatically generated based on the connection in the logic circuit.

However, the above scan design system has a disadvantage that a large amount of hardware must be added, and at the time of test, time for the scan-in and scan-out may become excessively long depending on the number of stages of the flip-flop circuits, thereby making the entire test time longer.

A semiconductor integrated circuit in which the scan-in and scan-out operations can be effected in a short period of time with a simple circuit construction and with a slight increase in the number of input and output pins in a case where the internal logic circuit is divided into multiple blocks and it is desired to effect the test for each block is proposed in Japanese Patent Application No. 62-78551 (Japanese Patent Disclosure No. 63-243890) which was filed before the present application and made by the same inventor of the present application.

Figure 2:
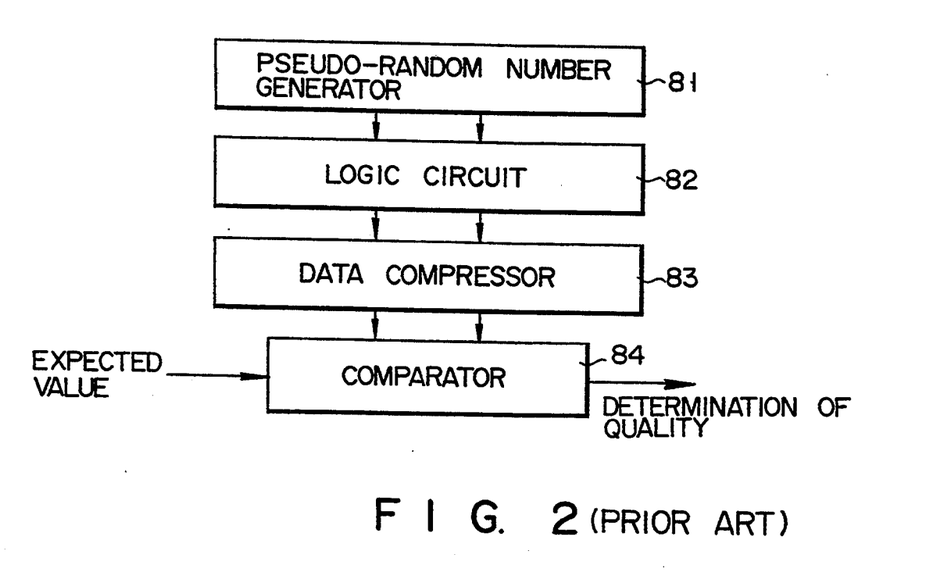
FIG. 2 is a block diagram showing the conventional compact test system.

As shown in FIG. 2, the compact test system is a method to generate a test vector by use of a pseudo-random number generator 81 which is represented by a linear feedback shift register (LFSR) having a feedback loop in which an exclusive OR gate is provided, for example, input the thus generated test vector to a logic circuit 82, compress an output signal from the logic circuit 82 by means of a data compressor 83, and then compare the compression result with an expected value so as to check whether the circuit is defective or not.

The compact test system is advantageous over the scan design system in that an amount of added hardware can be reduced but is not suitable for analysis of the defect.

Figure 3:
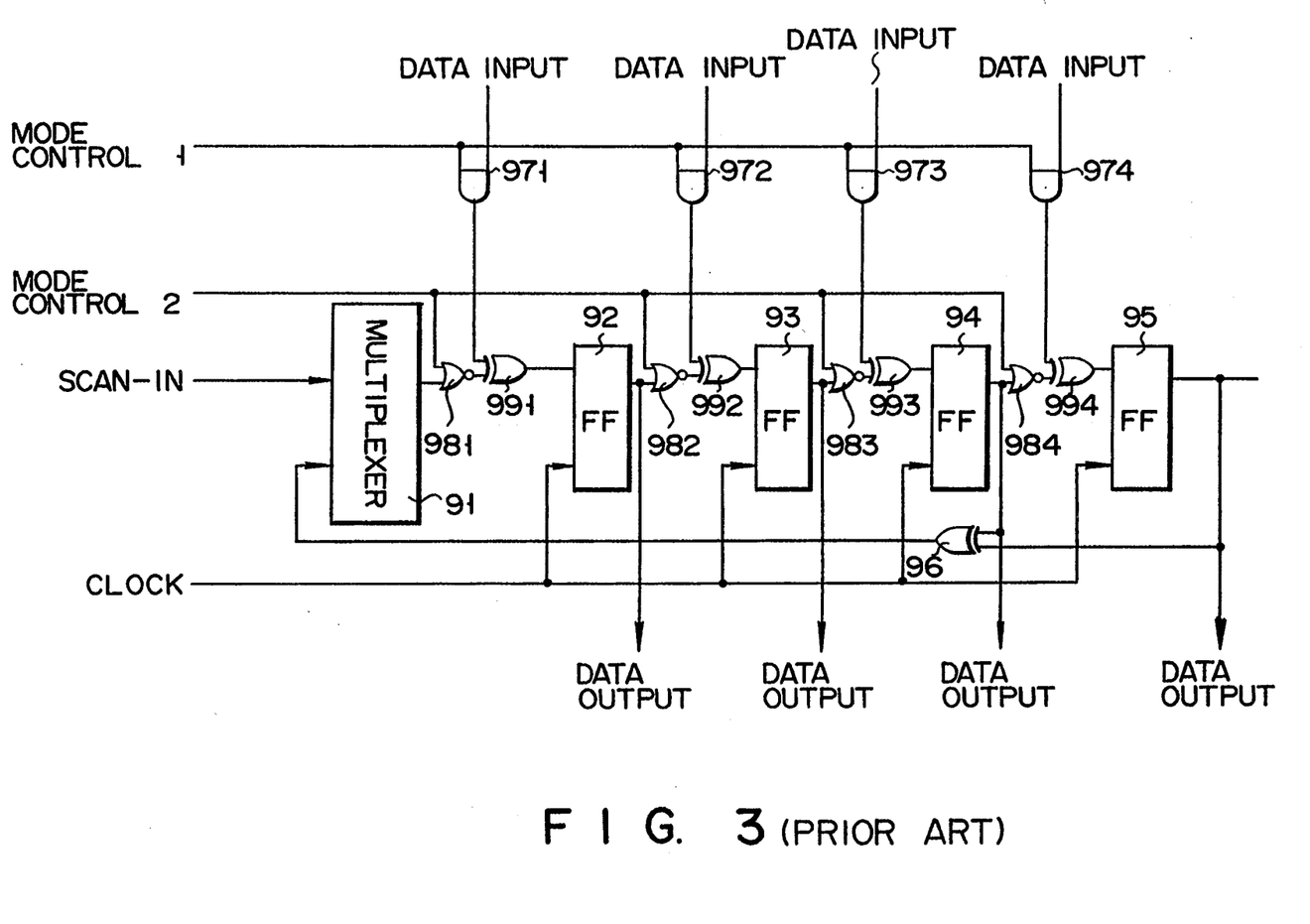
FIG. 3 is a block diagram showing the basic construction of the conventional BILBO system.

Further, the basic construction of a method called a BILBO (Built-In Logic Block Observation) system which is a combination of the scan design system and the compact test system is shown in FIG. 3. The construction includes a feedback loop containing a multiplexer 91, flip-flop (FF) circuits 92 to 95 and an exclusive OR gate 96, and groups of gate circuits 971 to 974, 981 to 984 and 991 to 994. The operation mode of the BILBO system includes four modes of a reset mode for resetting the flip-flop circuits 92 to 95, a normal latch mode for effecting the normal operation of the flip-flop circuits 92 to 95, a scan pass mode for effecting the scanning operation of the flip-flop circuits 92 to 95, and an LFSR mode for effecting the pseudo-random number generating operation by using the flip-flop circuits 92 to 95 as a linear feedback shift register by use of the feedback loop, and various tests for the logic circuit can be made.

However, the above BILBO system has a disadvantage that it will depend on the mathematical method such as irreducible polynomials when the number of stages of the LFSR for effecting the pseudo-random number generating operation is large.

SUMMARY OF THE INVENTION

The present has been made to solve the above problems, and an object of this invention is to provide a semiconductor integrated circuit in which pseudo-random number data can be set in an internal logic circuit which is divided into blocks in a short period of time with a simple circuit construction and with a slight increase in the number of input and output pins and thus the test for the logic circuit block can be simplified.

A semiconductor integrated circuit of the present invention comprises: a flip-flop circuit group having a plurality of flip-flop circuits of n rows×m columns in which the flip-flop circuits of one row are serially connected in a direction from the scan-in terminal to the scan-out terminal thereof to constitute a row-direction shift register, the flip-flop circuits of each column are connected to constitute a column-direction shift register, and each stage of the row-direction shift register is so constructed that the data shifting direction thereof can be changed to a row direction or column direction according to a control signal; a row-direction pseudo-random number generator for generating pseudo-random number data by selectively using the row-direction shift register as a linear feedback shift register; and a logic circuit block connected to input or output data with respect to each stage of the column-direction shift register of each column.

Random number data can be set into all of the flip-flop circuits by repeatedly effecting the operation of transferring the random number data to the column-direction shift registers of respective columns after the random number data is generated from the row-direction pseudo-random number generator. Then, after the random number data in the flip-flop circuits is input to the logic circuit block and the logic circuit block is operated, data in the logic circuit block is transferred to the column-direction shift register of each column and then output for observation via the row-direction shift register.

In this case, since the internal logic circuit is divided into multiple blocks, the scan-in and scan-out can be effected in a short period of time with a simple circuit construction and with a slight increase in the number of input and output pins. Further, the construction of the pseudo-random number generator is made simpler in comparison with the BILBO system and a large random number can be created with a pseudo-random number generator of less stages and less clocks, and consequently, the scan-in and scan-out can be effected in a shorter period of time in comparison with the scan design system.

Another semiconductor integrated circuit of the present invention comprises: a flip-flop circuit group having a plurality of flip-flop circuits of n rows × m columns in which the flip-flop circuits of each row are serially connected in a direction from the scan-in terminal to the scan-out terminal thereof to constitute a row-direction shift register, the flip-flop circuits of each column are connected to constitute a column-direction shift register, and each stage of the row-direction shift register of each row is so constructed that the data shifting direction thereof can be changed to a row direction or column direction according to a control signal; row-direction pseudo-random number generators for generating pseudo-random number data by selectively using the row-direction shift register of each row as a linear feedback shift register; and a logic circuit block connected to input or output data with respect to each stage of the column-direction shift register of each column.

Still another semiconductor integrated circuit of the present invention comprises: a flip-flop circuit group having a plurality of flip-flop circuits of n rows × m columns in which the flip-flop circuits of one row are serially connected in a direction from the scan-in terminal to the scan-out terminal thereof to constitute a row-direction shift register, the flip-flop circuits of each column are connected to constitute a column-direction shift register, and each stage of the row-direction shift register is so constructed that the data shifting direction thereof can be changed to a row direction or column direction according to a control signal; row-direction pseudo-random number generators for generating pseudo-random number data by selectively using the row-direction shift register as a linear feedback shift register; column-direction pseudo-random number generators for generating pseudo-random number data by selectively using one of the column-direction shift registers as a linear feedback shift register; and a logic circuit block connected to input or output data with respect to each stage of the column-direction shift register of each column.

Another semiconductor integrated circuit of the present invention comprises: a flip-flop circuit group having a plurality of flip-flop circuits of n rows × m columns in which the flip-flop circuits of each row are serially connected in a direction from the scan-in terminal to the scan-out terminal thereof to constitute a row-direction shift register, the flip-flop circuits of each column are connected to constitute a column-direction shift register, and each stage of the row-direction shift register of each row is so constructed that the data shifting direction thereof can be changed to a row direction or column direction according to a control signal; row-direction pseudo-random number generators for generating pseudo-random number data by selectively using the row-direction shift register of each row as a linear feedback shift register; column-direction pseudo-random number generators for generating pseudo-random number data by selectively using the column-direction shift register of each column as a linear feedback shift register; and a logic circuit block connected to input or output data with respect to each stage of the column-direction shift register of each column.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

There will now be described embodiments of the present invention with reference to the accompanying drawings.

Figure 4:
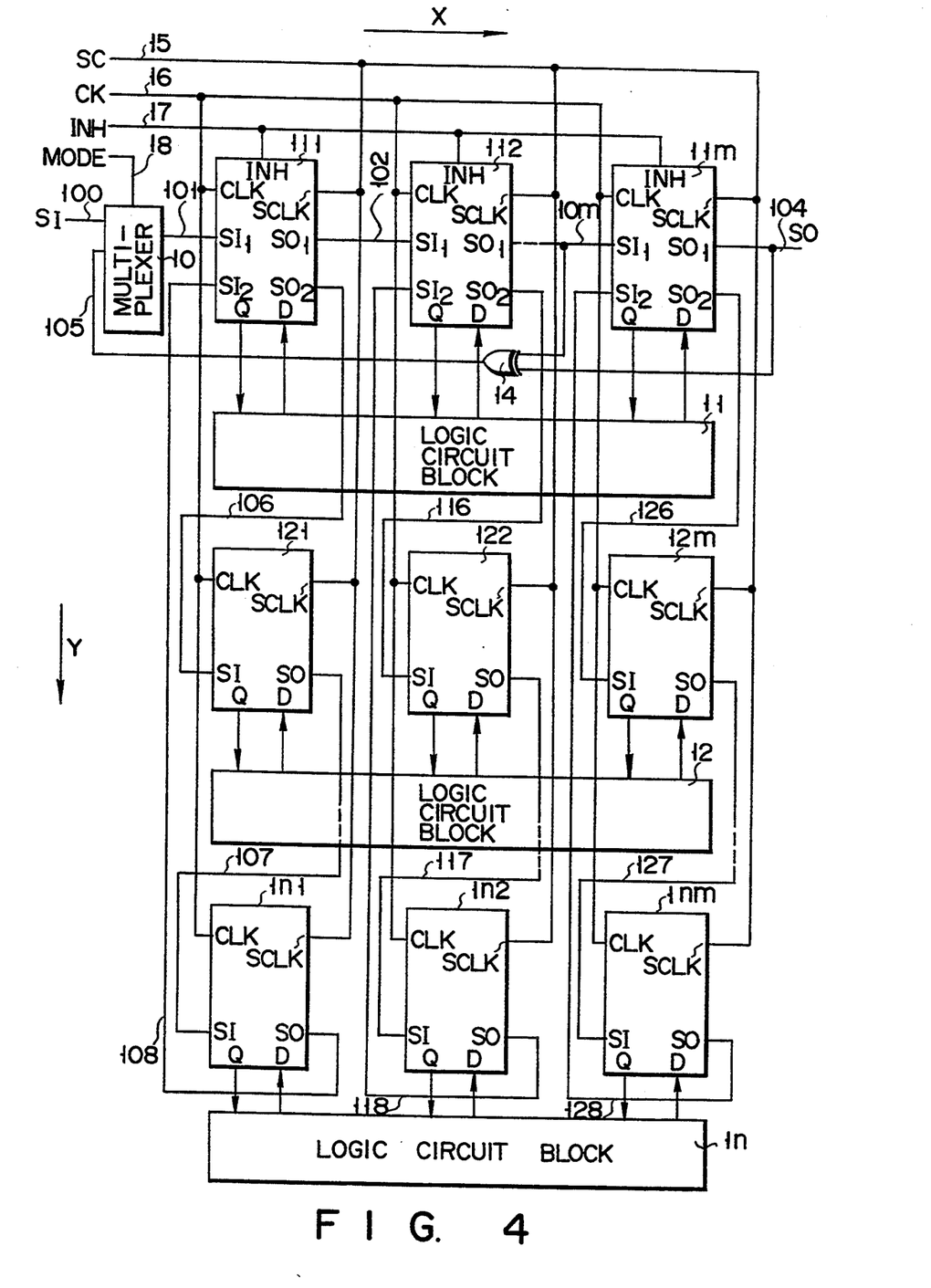
FIG. 4 is a block diagram showing part of semiconductor integrated circuit according to a first embodiment of the present invention.

FIG. 4 shows part of a semiconductor integrated circuit according to a first embodiment of the present invention. In FIG. 4, 111 to 1nm denote a plurality of flip-flop circuits of n rows × m columns. That is, m flip-flop circuits are arranged in the row direction (in the horizontal direction in the drawing, X direction) and n flip-flop circuits are arranged in the column direction (vertical direction in the drawing, Y direction). One row of the flip-flop circuits in the flip-flop circuit group, for example, the flip-flop circuits 111 to 11m of the first row are serially connected in a direction from the scan-in terminal to the scan-out terminal to constitute a row-direction shift register, and the flip-flop circuits 111 to 1n1, 112 to 1n2, ..., and 11m to 1nm of respective columns are connected to respectively constitute column-direction shift registers. In this case, each stage of the row-direction register of the first row is so constructed that the data shifting direction thereof can be changed to a row direction or column direction according to a control signal (inhibit signal INH).

Further, a row-direction pseudo-random number generator for generating pseudo-random number data by selectively using the row-direction shift register of the first row as a linear feedback shift register is provided. An example of the row-direction pseudo-random number generator includes a feedback loop having an exclusive OR gate 14 connected between the last-stage output and the first-stage input of the first-row shift register and a multiplexer 10 for selecting scan-in data (test data) from the scan-in terminal SI or a gate output (feedback data) 105 of the feedback loop as input data to the the first-stage scan-in terminal SI$_1$ of the first-row shift register according to a mode changing signal MODE, and a linear feedback shift register (LFSR) is formed by selecting the gate output 105 of the feedback loop as scan data input of the first stage of the first-row shift register by means of the multiplexer 10.

Further, respective stages of the column-direction shift registers of respective columns are connected to set input data into or receive output data from the logic circuit blocks 11 to 1n.

In the drawing, 15 denotes a scan clock (SC) signal line, 16 a system clock (CK) signal line, 17 an inhibit signal line, 18 a mode signal line, 100 a scan-in signal line, 101 to 10m scan passes in the X direction, 104 a scan-out signal line, and 106 to 108, 116 to 118 and 126 to 128 scan passes in the Y direction.

Further, means for effecting the control described below at the time of test of the above integrated circuit is provided. First, an initial value is set into the first-row shift register by controlling the multiplexer 10 according to the mode changing signal MODE and scanning the scan-in data (test data) which is input via the scan-in signal line 100 from the scan-in terminal SI in a horizontal direction via the X-direction scan passes 101 to 10m. Next, the gate output 105 of the feedback loop is selected to operate the first-row shift register as the LFSR by controlling the multiplexer 10 according to the mode changing signal MODE. Then, the data scanning direction of the first-row shift register is changed by the inhibit signal INH to effect the data scan in the vertical direction by means of the shift registers of the respective columns. By the above sequence of control operations, random number data generated from the LFSR is set into all of the flip-flop circuits 111 to 1nm and input to the logic circuit blocks 11 to 1n as the pseudo-random number test pattern. Next, after the logic circuit blocks 11 to 1n are operated, outputs of the logic circuit blocks 11 to 1n are received into the shift registers of respective columns, and then, after data of the shift registers of respective columns are scanned in the vertical direction to set the data into the first-row shift register, the data scanning direction of the first-row shift register is changed by the inhibit signal INH and the data in the first-row shift register is scanned in the horizontal direction and output from the scan-out terminal SO via the scan-out signal line 104.

Figure 5:
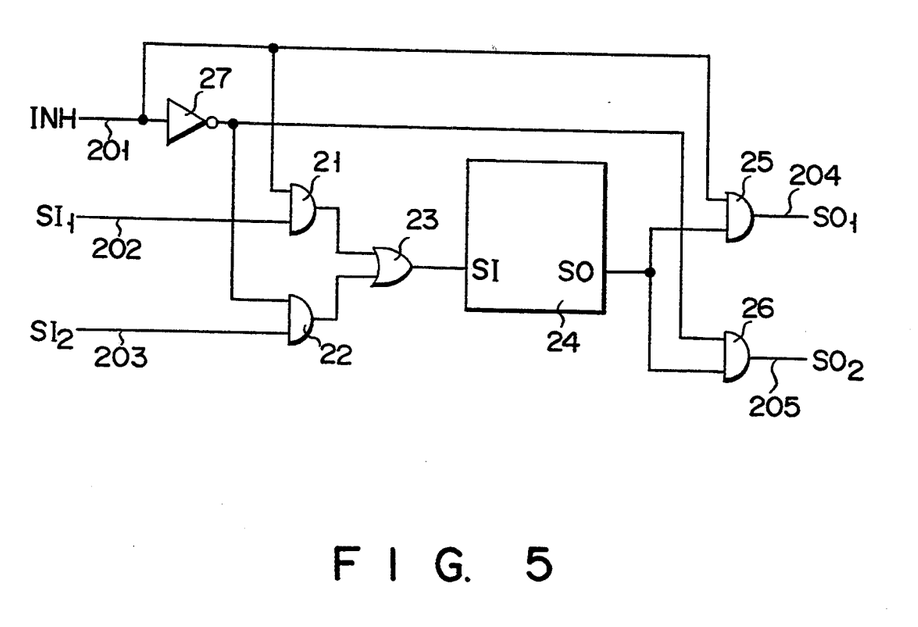
FIG. 5 is a circuit diagram showing an example of an internal structure obtained by extracting one of the flip-flop circuits of the first row shown in FIG. 4.

The first-row scan-in/scan-out switching type flip-flop circuits 111 to 11m each have an input selecting section for selecting one of the two input terminals and an output selecting section for selecting one of the two output terminals and are constructed so that the input selecting section and output selecting section can be controlled by the control signal INH. More specifically, two systems of scan-in terminals SI$_1$ and SI$_2$, AND gates 21, 22, 25 and 26, OR gate 23, flip-flop circuit 24 for normal scanning design, inverter circuit 27, two systems of scan-out terminals SO$_1$ and SO$_2$, inhibit signal line 201, two series of scan-in signal lines 202 and 203, and two series of scan-out signal lines 204 and 205 are connected as shown in FIG. 5, for example. If the inhibit signal INH is "0", the scan-in terminal SI$_1$ and scan-out terminal SO$_1$ are selected and if the inhibit signal INH is "1", the scan-in terminal SI$_2$ and scan-out terminal SO$_2$ are selected.

A flip-flop circuit having a scan-in terminal SI and scan-out terminal SO of single series for normal scan design is used for the flip-flop circuits 121 to 1nm of the other rows.

According to the integrated circuit of the first embodiment, after random number data is generated from the LFSR formed by selecting the gate output of first-row feedback loop as the first-stage scan data input of the first-row shift register, the operation of transferring the random number data to the shift registers of the respective columns is repeatedly effected so as to set the random number data into all of the flip-flop circuits. Then, after the random number data of the flip-flop circuits is input to the logic circuit block and the logic circuit block is operated, data of the logic circuit block is received into the flip-flop circuits and output via the first-row shift register so that the data can be compared with an expected value.

In this case, since the internal logic circuit is divided into multiple blocks, the scan-in and scan-out operations can be effected in a short period of time with a simple circuit construction and with a slight increase in the number of input and output pins. Further, the construction of the LFSR is simplified in comparison with the case of the BILBO system and a large random number can be created by use of the LFSR of less stages and less clocks so that the scan-in and scan-out operations can be effected in a short period of time in comparison with the scan design system. It is also possible to effect the test by use of less clocks in a case where the test for a multiplexed logic circuit such as the practically operable circuit and the preparatory circuit is effected.

Figure 6:
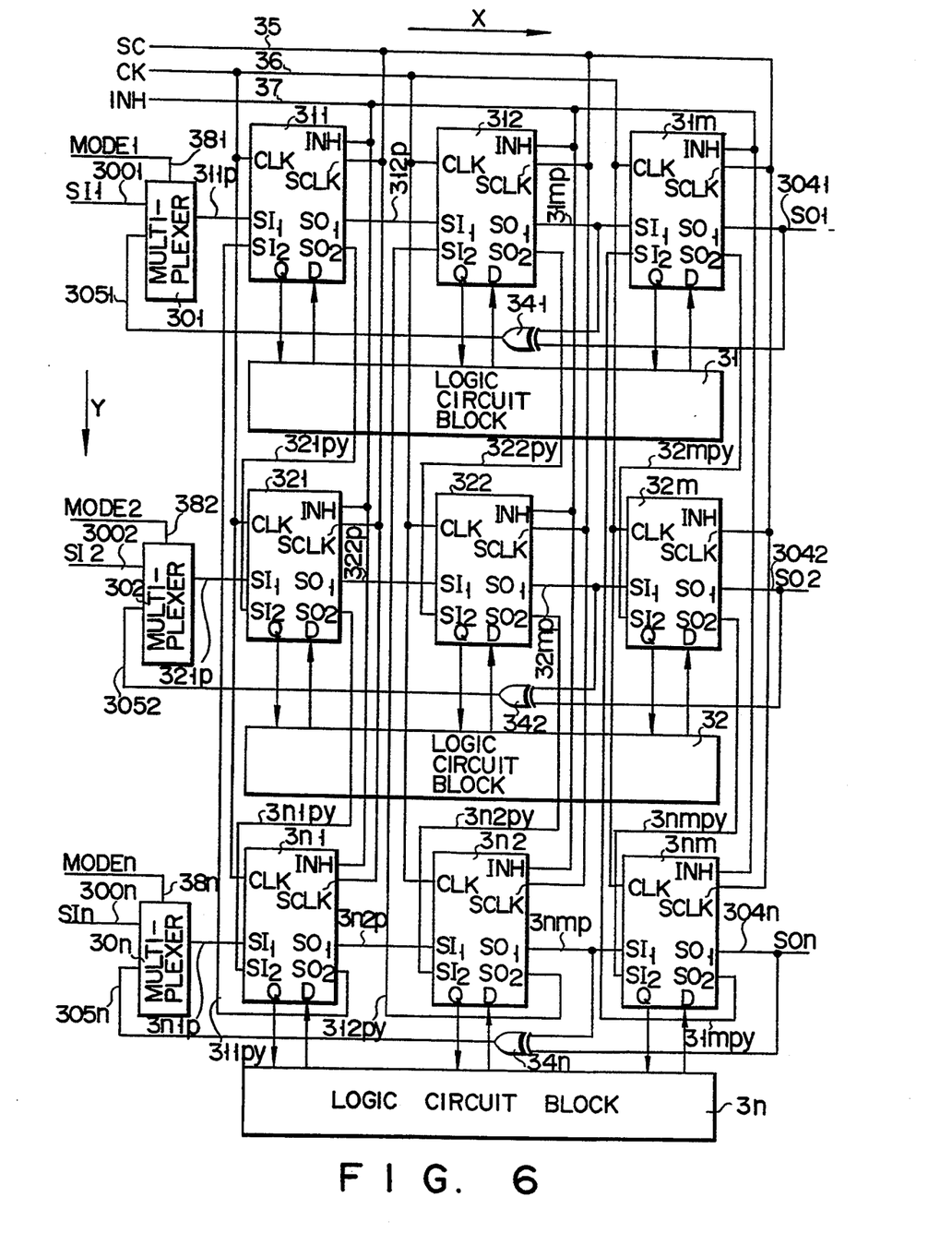
FIG. 6 is a block diagram showing part of a semiconductor integrated circuit according to second embodiment of the present invention.

FIG. 6 shows part of a semiconductor integrated circuit according to a second embodiment which is similar to the first embodiment except that (1) the flip-flop circuits 321 to 32m, ..., and 3n1 to 3nm of the second row and succeeding rows are serially connected in a direction from the scan-in terminal to the scan-out terminal to constitute respective shift registers in the same manner as in the first-row flip-flop circuits 311 to 31m and the data shifting direction of the flip-flop circuits can be selectively set to the row direction or column direction according to the control signal INH, (2) each of feedback loops respectively including exclusive OR gates 341 to 34n and each of multiplexers 301 to 30n are provided for a corresponding one of the shift registers of respective rows, and (3) control means is used for setting random number data into all of the flip-flop circuits by causing the random number data to be generated from the LFSR constituted by selecting gate outputs 3051 to 305n of the feedback loops as the scan data inputs of the first stages of the respective shift registers.

In FIG. 6, 31 to 3n denote logic circuit blocks, 35 a scan clock (SC) signal line, 36 a system clock (CK) signal line, 37 an inhibit signal line, 38 a mode signal line, 3001 to 300n scan-in signal lines, 311p to 31mp, 321p to 32mp and 3n1p to 3nmp X-direction scan passes, 3041 to 304n scan-out signal lines, 311py to 3n1py, 312py to 3n2py and 31mpy to 3nmpy Y-direction scan passes, and MODE1 to MODEn mode changing signals.

According to the second embodiment, the scan-in/scan-out and the LFSR operation can be directly effected with respect to a desired row in the same manner as in the case of the first row. Therefore, at the time of defect analysis of the logic circuit block, it can be operated as a scan design circuit which can check each of the logic circuit blocks at a high speed.

Figure 7:
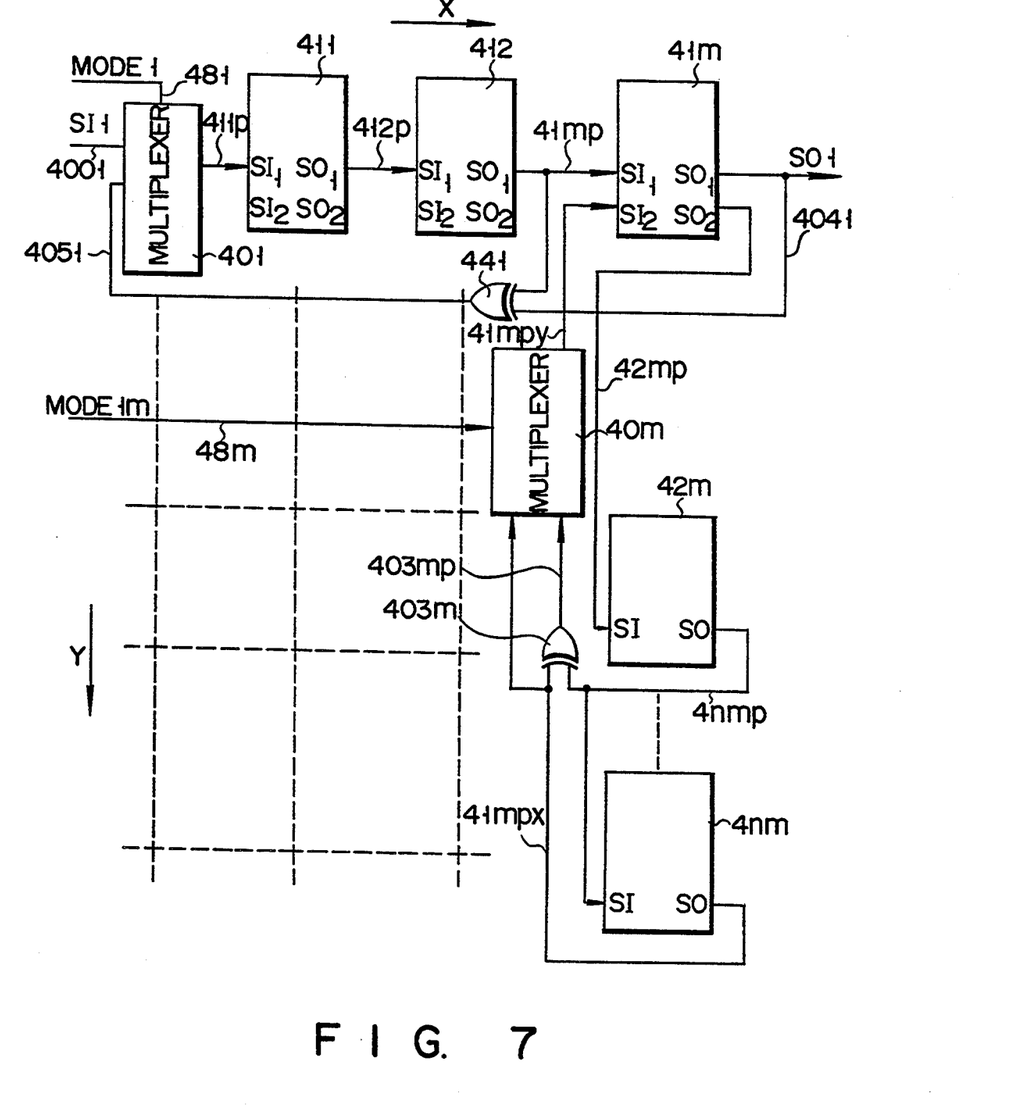
FIG. 7 is a block diagram showing part of a semiconductor integrated circuit according to third embodiment of the present invention.

FIG. 7 shows part of a semiconductor integrated circuit according to a third embodiment having a plurality of flip-flop circuits of n rows×m columns. In FIG. 7, the first-row flip-flop circuits 411 to 41m and the last-column flip-flop circuits 41m to 4nm are shown but the flip-flop circuits of the first to (m–l)th columns of the second to n-th rows are not shown. The third embodiment is similar to the first embodiment except that (1) a column direction pseudo-random number generator is provided in the shift register of a desired column, for example, of the last column, the generator has a column shift register feedback loop including an exclusive OR gate 403m and a multiplexer 40m and generates pseudo-random number data by selectively using the last-column shift register as a linear feedback shift register LFSR, and (2) control means is used for causing random number data to be generated from the LFSR formed by selecting a gate output 41mpx of the first-row feedback loop as the first-stage scan data input of the first-row shift register, repeatedly effecting the operation of transferring the random number data to the shift registers of the respective columns, and setting random number data into all of the flip-flop circuits by causing the random number data to be generated from the LFSR constituted by selecting a gate output 403m of the column shift register feedback loop as the scan data input of the first stage of the last-column shift register.

In FIG. 7, 401 denotes a multiplexer for the first-row shift register, 441 a exclusive OR gate of the first-row feedback loop, 4501 a gate output of the first-row feedback loop, SI1 and SO1 scan-in and scan-out terminals of the first row, 4001 a scan-in signal line, 411p to 41mp X-direction scan passes, 4041 a scan-out signal line, 41mpx to 41nmp Y-direction scan passes, 481 and 48m mode signal lines, MODE1 a mode changing signal for the first-row shift register, and MODE1m a mode changing signal for the last-column shift register.

According to the third embodiment, the last-column shift register can effect the LFSR operation by controlling the last-column multiplexer 40m by the mode changing signal MODE1m so as to select the last-stage output or the gate output 403m of the column shift register feedback loop. Thus, the pseudo-random number data in a vertical direction can be generated and a pseudo-random test pattern better than that of the first embodiment can be obtained.

Figure 8:
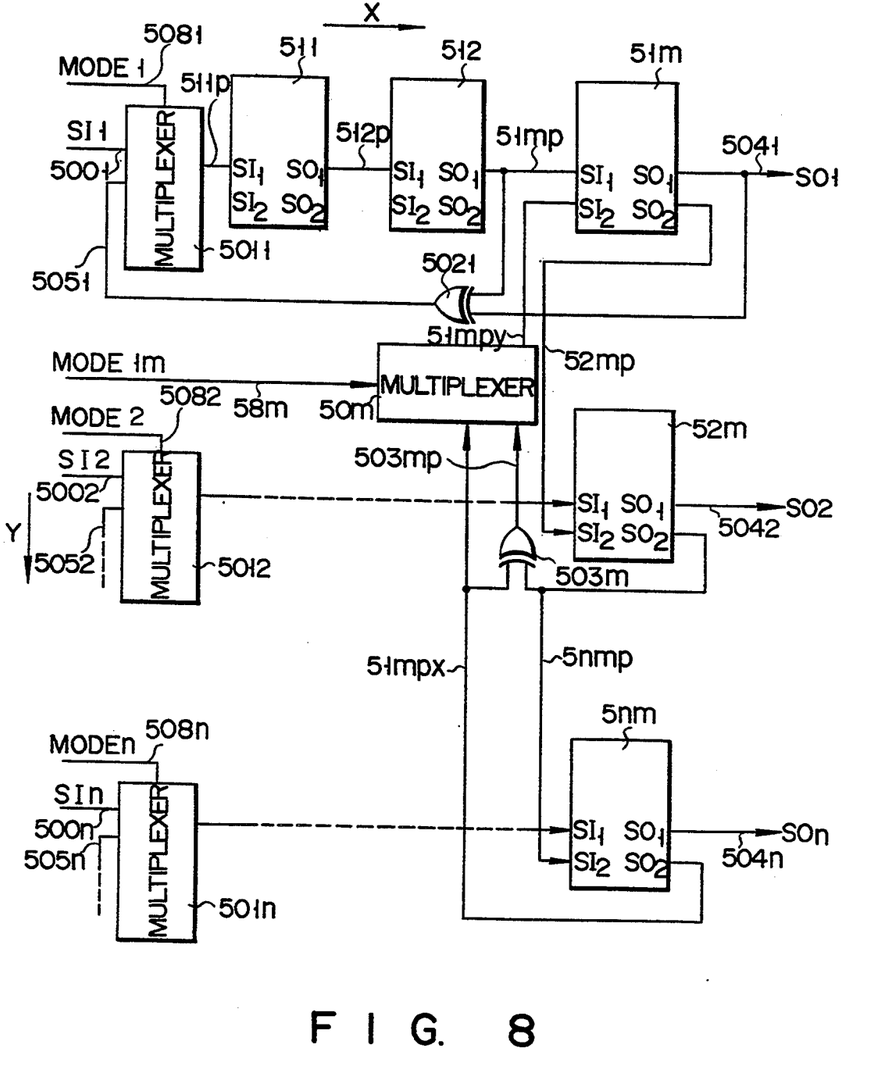
FIG. 8 is a block diagram showing part of a semiconductor integrated circuit according to a fourth embodiment of the present invention.

FIG. 8 shows part of a semiconductor integrated circuit according to a fourth embodiment having a plurality of flip-flop circuits of n rows×m columns. In FIG. 8, the first-row flip-flop circuits 511 to 51m and the last-column flip-flop circuits 51m to 5nm are shown but the flip-flop circuits of the first to (m–l)th columns of the second to n-th rows are not shown. The fourth embodiment is similar to the first embodiment except that (1) the flip-flop circuits of the second row and succeeding rows are serially connected in a direction from the scan-in terminal to the scan-out terminal to constitute respective shift registers in the same manner as in the first-row flip-flop circuits and the data shifting direction of the flip-flop circuits can be selectively set to the row direction or column direction according to the control signal INH (not shown), (2) each of feedback loops respectively including exclusive OR gates 5021 to 502n (not shown) and each of multiplexers 5011 to 501n are provided for a corresponding one of the shift registers of respective rows, and (3) each of feedback loops for the column shift registers respectively including exclusive OR gates 5031 to 503m (not shown) and each of multiplexers 501 to 50m (not shown) are provided for a corresponding one of the shift registers of respective columns.

In FIG. 8, 5051 denotes a gate output of the first-row feedback loop, 503p a gate output of the last-column feedback loop, SI1 to SIn scan-in terminals, SO1 to SOn scan-out terminals, 5001 to 500n scan-in signal lines, 511p to 51mp X-direction scan passes, 5041 to 504n scan-out signal lines, 51mpx, 51mpy, 52mp and 5nmp Y-direction scan passes, 5081 to 508m and 58m mode signal lines, and MODE1 to MODEn mode changing signals for the respective rows.

According to the fourth embodiment, the scan-in/scan-out and the LFSR operation can be directly effected for each row in the same manner as in the case of the first row and not only the data shifting operation in the vertical direction but also the LFSR operation can be effected for each column. The shift register of each column can be used as a data compressor for the data output, and at this time, it is not always necessary to use all of the scan data outputs of respective rows.

Figure 9:
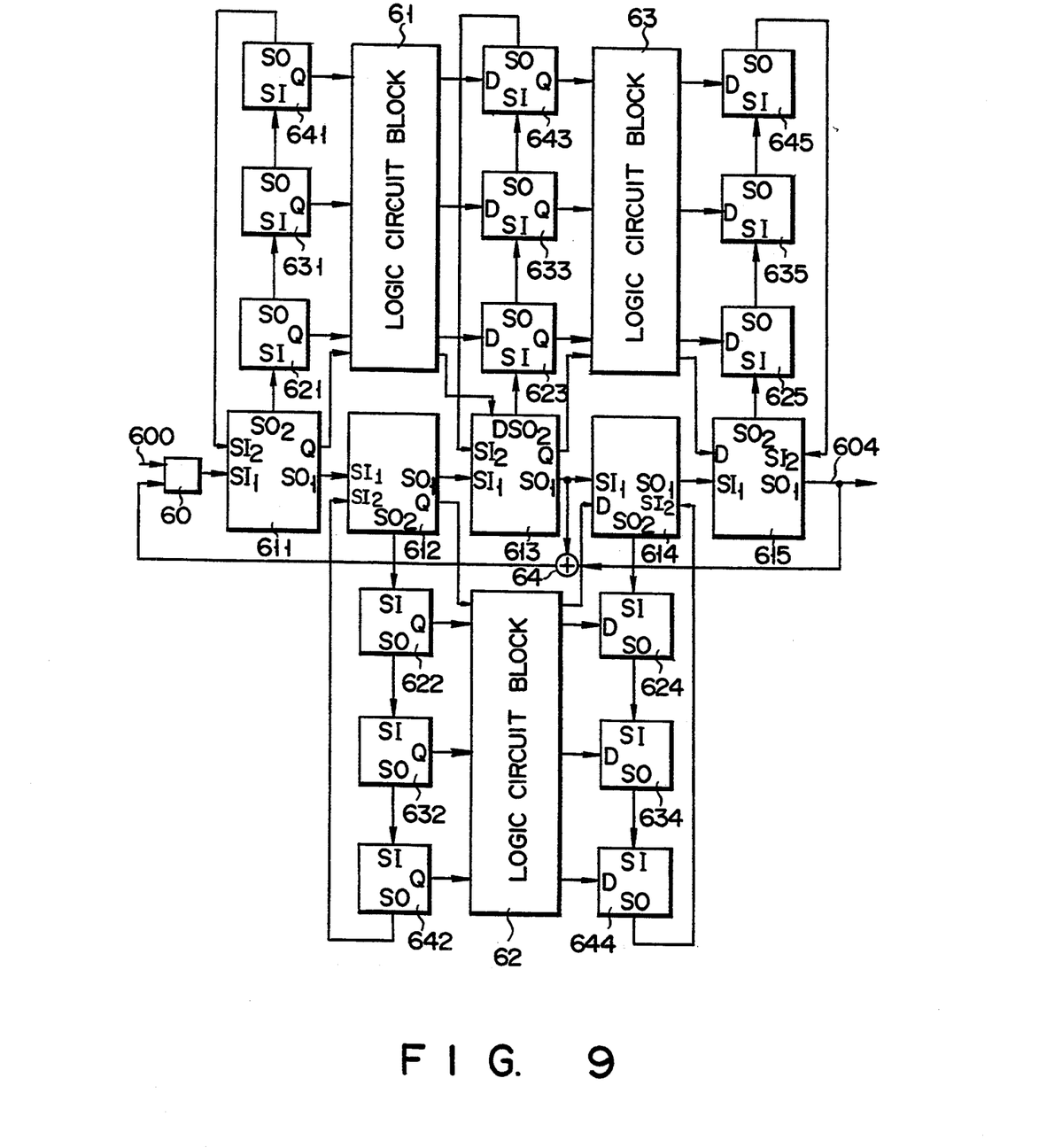
FIG. 9 is a block diagram showing part of a semiconductor integrated circuit according to a fifth embodiment of the present invention.

FIG. 9 shows part of a semiconductor integrated circuit according to a fourth embodiment which is similar to the first embodiment except the connection between the shift registers and the logic circuit blocks 61 to 6n. In FIG. 9, 611 to 615 denote flip-flop circuits, 60 denotes a multiplexer for the first-row shift register, and 64 denotes an exclusive OR gate included in the first-row feedback loop, but clock input terminals of all of the flip-flop circuits, the mode changing signal for the first-row shift register and the inhibit signal for the first-row shift register are omitted. Further, in FIG. 9, 600 denotes a scan-in signal line and 604 denotes a scan-out signal line.

In the first embodiment, the logic circuit blocks 11 to 1n are connected between the shift registers of respective rows and data is input and output between the shift registers of respective rows and the logic circuit blocks 11 to 1n. However, in the fifth embodiment, the logic circuit blocks 61 to 6n are connected between the shift registers of respective columns and data is input or output between the logic circuit blocks 61 to 6n and the shift registers of respective columns.

According to the fifth embodiment, an initial value is input to the first-row shift register in the scan-in method. Then, a pseudo-random number is set by setting the first-row shift register into the LFSR operation mode. Next, the data shifting direction is changed to the vertical direction, and at the same time, the first-row shift register is set into the LFSR operation mode again to set a pseudo-random number. While the above sequence of operations are repeatedly effected, the pseudo-random number is set into all of the flip-flop circuits and the logic circuit blocks. Next, the logic circuit block is operated to supply an output thereof to all of the flip-flop circuits and the data is output from the scan-out terminal while the data shifting direction of the flip-flop circuits is changed, making it possible to monitor the output data.

As described above, according to this invention, a semiconductor integrated circuit can be provided in which pseudo-random number data can be set in a short period of time into the internal logic circuit which is divided into multiple blocks with a simple circuit construction and with a slight increase in the number of input and output pins so that the test for the logic circuit blocks can be simplified.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor integrated circuit comprising:
    a flip-flop circuit group having a plurality of flip-flop circuits of n rows×m columns in which the flip-flop circuits of one row are serially connected in a direction from the scan-in terminal to the scan-out terminal thereof to constitute a row-direction shift register, the flip-flop circuits of each column are connected to constitute a column-direction shift register, and each stage of said row-direction shift register is so constructed that the data shifting direction thereof can be changed to a row direction or column direction according to a control signal;
    a row-direction pseudo-random number generator for generating pseudo-random number data by selectively using said row-direction shift register as a linear feedback shift register, said pseudo-random number generator including a feedback loop having an exclusive OR gate which is connected between the last-stage output and first-stage input of said row-direction shift register and which has a predetermined number of inputs supplied from selected row-direction output terminals of said flip-flop circuits according to the number of column, and a multiplexer for selecting one of scan-in data and feedback data of said feedback loop as scan data input of the first stage of said row-direction shift register so that said pseudo-random number generator constitutes said linear feedback shift register by causing said multiplexer to select the feedback data of said feedback loop as the scan data input of the first stage of said row-direction shift registers; and
    a logic circuit block connected to input or output data with respect to each stage of said column-direction shift register of each column.

2. A semiconductor integrated circuit according to claim 1, further comprising control means for setting random number data into all of said flip-flop circuits by repeatedly effecting the operation of transferring the random number data to said column-direction shift register of each column after the random number data is generated from said row-direction pseudo-random number generator.

3. A semiconductor integrated circuit according to claim 1, wherein the flip-flop circuits which are serially connected in a direction from the scan-in terminal to the scan-out terminal to constitute said shift register and whose data shifting direction is selectively set to the row direction or column direction according to a control signal each have an input selecting section for selecting one of two input terminals and an output selecting section for selecting one of two output terminals, said input and output selecting sections being controlled by the control signal.

4. A semiconductor integrated circuit comprising:
    a flip-flop circuit group having a plurality of flip-flop circuits of n rows×m columns in which the flip-flop circuits of one row are serially connected in a direction from the scan-in terminal to the scan-out terminal thereof to constitute a row-direction shift register, the flip-flop circuits of each column are connected to constitute a column-direction shift register, and each stage of said row-direction shift register is so constructed that the data shifting direction thereof can be changed to a row direction or column direction according to a control signal;
    row-direction pseudo-random number generators for generating pseudo-random number data by selectively using said row-direction shift register of each row as a linear feedback shift register, said pseudo-random number generators including a feedback loop having an exclusive OR gate which is connected between the last-stage output and first-stage input of said row-direction shift registers and which has a predetermined number of inputs supplied from selected row-direction output terminals of said flip-flop circuits according to the number of column, and a multiplexer for selecting one of scan-in data and feedback data of said feedback loop as scan data input of the first stage of said row-direction shift register so that said pseudo-random number generator constitutes said linear feedback shift register by causing said multiplexer to select the feedback data of said feedback loop as the scan data input of the first stage of said row-direction shift registers; and
    a logic circuit block connected to input and/or output data with respect to each stage of said column-direction shift register of each column.

5. A semiconductor integrated circuit according to claim 4, further comprising control means for setting random number data into all of said flip-flop circuits by causing said row-direction pseudo-random number generators of each row to generate random number data.

6. A semiconductor integrated circuit according to claim 5, wherein the flip-flop circuits which are serially connected in a direction from the scan-in terminal to the scan-out terminal to constitute said shift register and whose data shifting direction is selectively set to the row direction or column direction according to a control signal each have an input selecting section for selecting one of two input terminals and an output selecting section for selecting one of two output terminals, said input and output selecting sections being controlled by the control signal.

7. A semiconductor integrated circuit comprising:
    a flip-flop circuit group having a plurality of flip-flop circuits of n rows×m columns in which the flip-flop circuits of one row are serially connected in a direction from the scan-in terminal to the scan-out terminal thereof to constitute a row-direction shift register, the flip-flop circuits of each column are connected to constitute a column-direction shift register, and each stage of said row-direction shift register is so constructed that the data shifting direction thereof can be changed to a row direction or column direction according to a control signal;

a row-direction pseudo-random number generator for generating pseudo-random number data by selectively using said row-direction shift register as a linear feedback shift register, said row-direction pseudo-random number generator including a feedback loop having an exclusive OR gate which is connected between the last-stage output and first-stage input of said row-direction shift registers and which has a predetermined number of inputs supplied from selected row-direction output terminals of said flip-flop circuits according to the number of column, and a multiplexer for selecting one of scan-in data and feedback data of said feedback loop as scan data input of the first stage of said row-direction shift register so that said row-direction pseudo-random number generator constitutes said linear feedback shift register by causing said multiplexer to select the feedback data of said feedback loop as the scan data input of the first stage of said row-direction shift reqisterg;

a column-direction pseudo-random number generator for generating pseudo-random number data by selectively using said column-direction shift registers as a linear feedback shift register, said column-direction pseudo-random number generator including a feedback loop having an exclusive OR gate which is connected between the last-stage output and first-stage input of said column-direction shift register and which has a predetermined number of inputs supplied from selected column-direction output terminals of said flip-flop circuits according to the number of row, and a multiplexer for selecting one of scan-in data and feedback data of said feedback loop as scan data input of the first stage of said column-direction shift register so that said column-direction pseudo-random number generator constitutes said linear feedback shift register by causing said multiplexer to select the feedback data of said feedback loop as the scan data input of the first stage of said column-direction shift register; and a logic circuit block connected to input or output data with respect to each stage of said column-direction shift register of each column.

8. A semiconductor integrated circuit according to claim 7, further comprising control means for setting random number data into all of said flip-flop circuits by repeatedly effecting the operation of transferring the random number data to said column-direction shift register of each column after the random number data is generated from said row-direction pseudo-random number generators and causing said column-direction pseudo-random number generators to generate random number data.

9. A semiconductor integrated circuit according to claim 7, wherein the flip-flop circuits which are serially connected in a direction from the scan-in terminal to the scan-out terminal to constitute said shift register and whose data shifting direction is selectively set to the row direction or column direction according to a control signal each have an input selecting section for selecting one of two input terminals and an output selecting section for selecting one of two output terminals, said input and output selecting sections being controlled by the control signal.

10. A semiconductor integrated circuit according to claim 7, wherein said row-direction pseudo-random number generator and said column-direction pseudo-random number generator are operated independently so that each generator generates a different pseudo-random number.

11. A semiconductor integrated circuit according to claim 7, wherein said row-direction pseudo-random number generator and said column-direction pseudo-random number generator are operated together so that different pseudo-random number from those generated by each of said row-direction pseudo-random number generator and said column-direction pseudo-random number generator.

12. A semiconductor integrated circuit comprising:
a flip-flop circuit group having a plurality of flip-flop circuits of n rows x m columns in which the flip-flop circuits of one row are serially connected in a direction from the scan-in terminal to the scan-out terminal thereof to constitute a row-direction shift register, the flip-flop circuits of each column are connected to constitute a column-direction shift register, and each stage of said row-direction shift register is so constructed that the data shifting direction thereof can be changed to a row direction or column direction according to a control signal;

row-direction pseudo-random number generators for generating pseudo-random number data by selectively using said row-direction shift registers of each row as a linear feedback shift register, said row-direction pseudo-random number generators including a feedback loop having an exclusive OR gate which is connected between the last-stage output and first-stage input of said row-direction shift registers and which has a predetermined number of inputs supplied from selected row-direction output terminals of said flip-flop circuits according to the number of column, and a multiplexer for selecting one of scan-in data and feedback data of said feedback loop as scan data input of the first stage of said row-direction shift registers so that said row-direction pseudo-random number generator constitutes said linear feedback shift register by causing said multiplexer to select the feedback data of said feedback loop as the scan data input of the first stage of said row-direction shift registers;

column-direction pseudo-random number generators for generating pseudo-random number data by selectively using said column-direction shift register of each column as a linear feedback shift register, said column-direction pseudo-random number generators including a feedback loop having an exclusive OR gate which is connected between the last-stage output and first-stage input of said column-direction shift registers and which has a predetermined number of inputs supplied from selected column-direction output terminals of said flip-flop circuits according to the number of row, and a multiplexer for selecting one of scan-in data and feedback data of said feedback loop as scan data input of the first stage of said column-direction shift registers so that said column-direction pseudo-random number generator constitutes said linear feedback shift register by causing said multiplexer to select the feedback data of said feedback loop as the scan data input of the first stage of said column-direction shift registers; and a logic circuit block connected to input or output data with respect to each stage of said column-direction shift register of each column.

13. A semiconductor integrated circuit according to claim 12, wherein the flip-flop circuits which are serially connected in a direction from the scan-in terminal to the scan-out terminal to constitute said shift register and whose data shifting direction is selectively set to the row direction or column direction according to a control signal each have an input selecting section for selecting one of two input terminals and an output selecting section for selecting one of two output terminals, said input and output selecting sections being controlled by the control signal.

14. A semiconductor integrated circuit according to claim 12, wherein said row-direction pseudo-random number generators and said column-direction pseudo-random number generators are operated independently so that respective generators generate different pseudo-random numbers.

15. A semiconductor integrated circuit accord to claim 14, wherein said row-direction pseudo-random number generators and said column-direction pseudo-random number generators are operated together so that different pseudo-random number from those generated by said row-direction pseudo-random number generators and said column-direction pseudo-random number generators.

* * * * *